(12) United States Patent
Hashiba et al.

(10) Patent No.: US 11,971,755 B2
(45) Date of Patent: Apr. 30, 2024

(54) ELECTRONIC APPARATUS

(71) Applicant: LENOVO (SINGAPORE) PTE. LTD., Singapore (SG)

(72) Inventors: Junki Hashiba, Yokohama (JP); Masahiro Kitamura, Yokohama (JP); Satoshi Douzono, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 17/822,154

(22) Filed: Aug. 25, 2022

(65) Prior Publication Data
US 2023/0147548 A1 May 11, 2023

(51) Int. Cl.
*G06F 1/16* (2006.01)
*H05K 7/20* (2006.01)

(52) U.S. Cl.
CPC ....... *G06F 1/1662* (2013.01); *H05K 7/20145* (2013.01)

(58) Field of Classification Search
CPC .......... G06F 1/1662; G06F 1/20; G06F 1/206; H05K 7/20136; H05K 5/0213; H05K 7/20972; H05K 7/20
See application file for complete search history.

(56) References Cited

U.S. PATENT DOCUMENTS

| 10,871,809 | B1* | 12/2020 | Horiuchi | ............... H01H 13/83 |
| 2015/0179358 | A1* | 6/2015 | Nakatani | ................. H01H 3/12 200/5 A |
| 2016/0118206 | A1* | 4/2016 | Wu | ....................... H01H 9/161 200/5 A |
| 2018/0330899 | A1* | 11/2018 | Chen | ..................... H03K 17/98 |
| 2021/0345502 | A1* | 11/2021 | He | ...................... H05K 9/0041 |

FOREIGN PATENT DOCUMENTS

| JP | 2000105636 A | 4/2000 |
| JP | 2009086704 A | 4/2009 |
| JP | 2013077267 A | 4/2013 |
| JP | 20211110999 A | 8/2021 |
| WO | 2007122286 A1 | 11/2007 |

* cited by examiner

*Primary Examiner* — James Wu
*Assistant Examiner* — Dakota M Talbert
(74) *Attorney, Agent, or Firm* — SHIMOKAJI IP (57) ABSTRACT

An electronic apparatus includes a chassis, a keyboard device which is installed on the upper surface side of the chassis and has a plurality of keycaps and a frame which is installed on the upper surface side of the chassis and isolates the respective keycaps of the keyboard device from one another, in which each of at least some of the plurality of keycaps has an upper plate which forms an operation surface, and side walls on four sides which are provided so as to hang down from a peripheral edge part of the upper plate and face the frame respectively, and in at least the side wall on one side of the side walls on the four sides, a flow path formation part which widens a clearance between that side wall and the frame and thereby forms an air flow path is provided.

9 Claims, 9 Drawing Sheets

ELECTRONIC APPARATUS

BACKGROUND OF THE INVENTION

Field of the Invention

The present invention relates to an electronic apparatus which includes a keyboard device.

Description of the Related Art

As a configuration of the electronic apparatus such as a laptop PC and so forth, there exists the configuration which includes a chassis which has a keyboard device on its upper surface and a cooling module which cools a heating element such as a CPU (Central Processing Unit) and so forth in the chassis (see, for example, Japanese Patent No. 6846547).

SUMMARY OF THE INVENTION

Since demand for thinning of the chassis is great in the electronic apparatus such as the one which is described above, it is difficult to secure a space for installation of a large-sized cooling module. For this reason, in the electronic apparatus of the above-mentioned type, there is concern that heat in the chassis will readily transfer to the keyboard device which is installed on the upper surface of the chassis and the heat will make a user uncomfortable. Particularly, as observed in the keyboard device in Japanese Patent No. 6846547, the configuration that each keycap is surrounded by a frame is small in the number of escape routes of heat which is transferred to the keyboard device from within the chassis and the above-described thermal problem readily occurs.

The present invention has been made in consideration of the problem of the above-described prior art and aims to provide an electronic apparatus which makes it possible to suppress temperature rising of a keyboard device which is installed on the upper surface side of the chassis.

The electronic apparatus according to the first aspect of the present invention includes a keyboard device which is installed on the upper surface side of the chassis and has a plurality of keycaps and a frame which is installed on the upper surface side of the chassis and isolates the respective keycaps of the keyboard device from one another, in which each of at least some of the plurality of keycaps has an upper plate which forms an operation surface, and side walls on four sides which are provided so as to hang down from a peripheral edge part of the upper plate and face the frame respectively and in at least the side wall on one side of the side walls on the four sides, a flow path formation part which widens a clearance between that side wall and the frame and thereby forms an air flow path is provided.

The electronic apparatus according to the second aspect of the present invention includes a chassis, a keyboard device which is installed on the upper surface side of the chassis and has a plurality of keycaps and a frame which is installed on the upper surface side of the chassis and isolates the respective keycaps of the keyboard device from one another, in which each of at least some of the plurality of keycaps has an upper plate which forms an operation surface, and side walls on four sides which are provided so as to hang down from a peripheral edge part of the upper plate and face the frame respectively and in at least the side wall on one side of the side walls on the four sides, a hole part or a recessed part is provided.

The electronic apparatus according to the third aspect of the present invention includes a chassis, a keyboard device which is installed on the upper surface side of the chassis and has a plurality of keycaps and a frame which is installed on the upper surface side of the chassis and isolates the respective keycaps of the keyboard device from one another, in which each of at least some of the plurality of keycaps has an upper plate which forms an operation surface, and side walls on four sides which are provided so as to hang down from a peripheral edge part of the upper plate and face the frame respectively and on at least the side wall on one side of the side walls on the four sides, an inclined plane which gradually inclines in a direction of separating from the frame toward a lower end of that side wall is provided.

According to one aspect of the present invention, it becomes possible to suppress the temperature rising of the keyboard device which is installed on the upper surface side of the chassis.

DETAILED DESCRIPTION OF THE INVENTION

In the following, an electronic apparatus according to the present invention will be described in detail by giving a preferable embodiment, with reference to the appended drawings.

Figure 1:
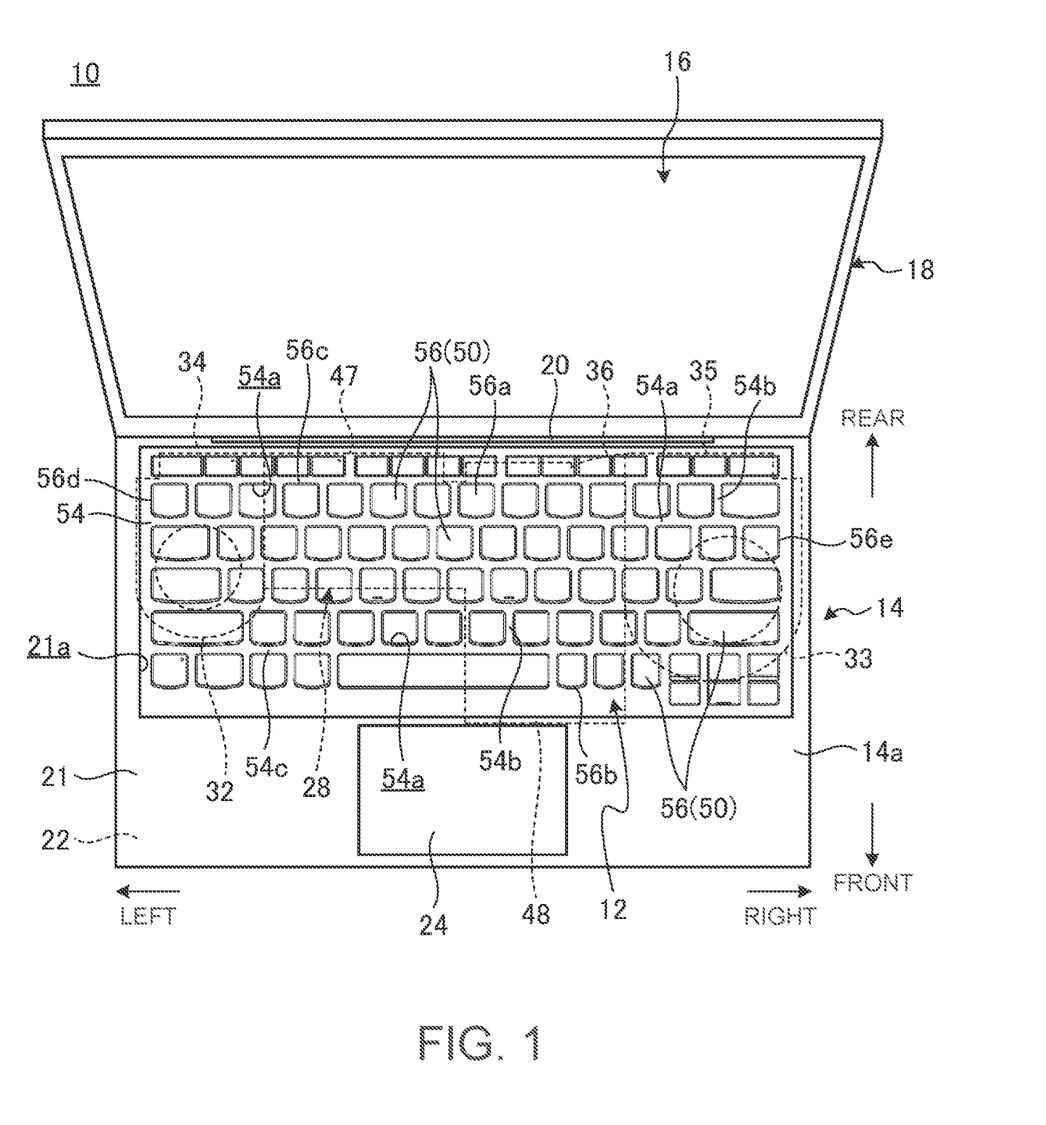
FIG. 1 is a schematic plan view illustrating one example of a state that an electronic apparatus according to one embodiment of the present invention is viewed from above.

FIG. 1 is a schematic plan view illustrating one example of a state that an electronic apparatus 10 according to one embodiment is viewed from above. As illustrated in FIG. 1, the electronic apparatus 10 includes a chassis 14 in which a keyboard device 12 is loaded and a display chassis 18 in which a display 16 is loaded. The electronic apparatus 10 is a clamshell-shape laptop PC that the chassis 14 and the display chassis 18 are coupled together via a hinge 20 to be rotationally movable relatively. FIG. 1 illustrates a state in which the display chassis 18 is opened from the chassis 14 to bring the electronic apparatus 10 into a usage form. The electronic apparatus 10 may be an electronic apparatus of a shape other than the clamshell-shape.

The display chassis 18 is a thin flattened box body. The display 16 is loaded on the display chassis 18. The display 16 is made of, for example, organic EL (electroluminescence), liquid crystal and so forth.

In the following, the chassis 14 and respective elements which are loaded on the chassis 14 will be described by calling the front side "front", the back side "rear", a width direction "left-right" and a height direction (a thickness direction of the chassis 14) "top-bottom", with a posture of operating the keyboard device 12 which is illustrated in FIG. 1 being set as a reference.

The chassis 14 is a thin flattened box body. The chassis 14 has a cover member 21 which forms an upper surface 14a and side faces on the periphery and a plate-shaped cover member 22 which forms a lower surface 14b (also, see FIG. 2). The cover members 21 and 22 are mutually superimposed in a thickness direction and are coupled together to be detachable. An opening 21a into which the keyboard device 12 is inserted from below is formed in the upper-side cover member 21 (also, see FIG. 2). The cover member 21 may be also configured to have a shallow bath-tab shape recessed part in place of the opening 21a and to place the keyboard device 12 into the recessed part from above.

The keyboard device 12 and a touch pad 24 are installed on the upper surface 14a of the chassis 14. The keyboard device 12 occupies the most part of the upper surface 14a. A rear end part of the chassis 14 is coupled with the display chassis 18 by using the hinge 20.

Figure 2:
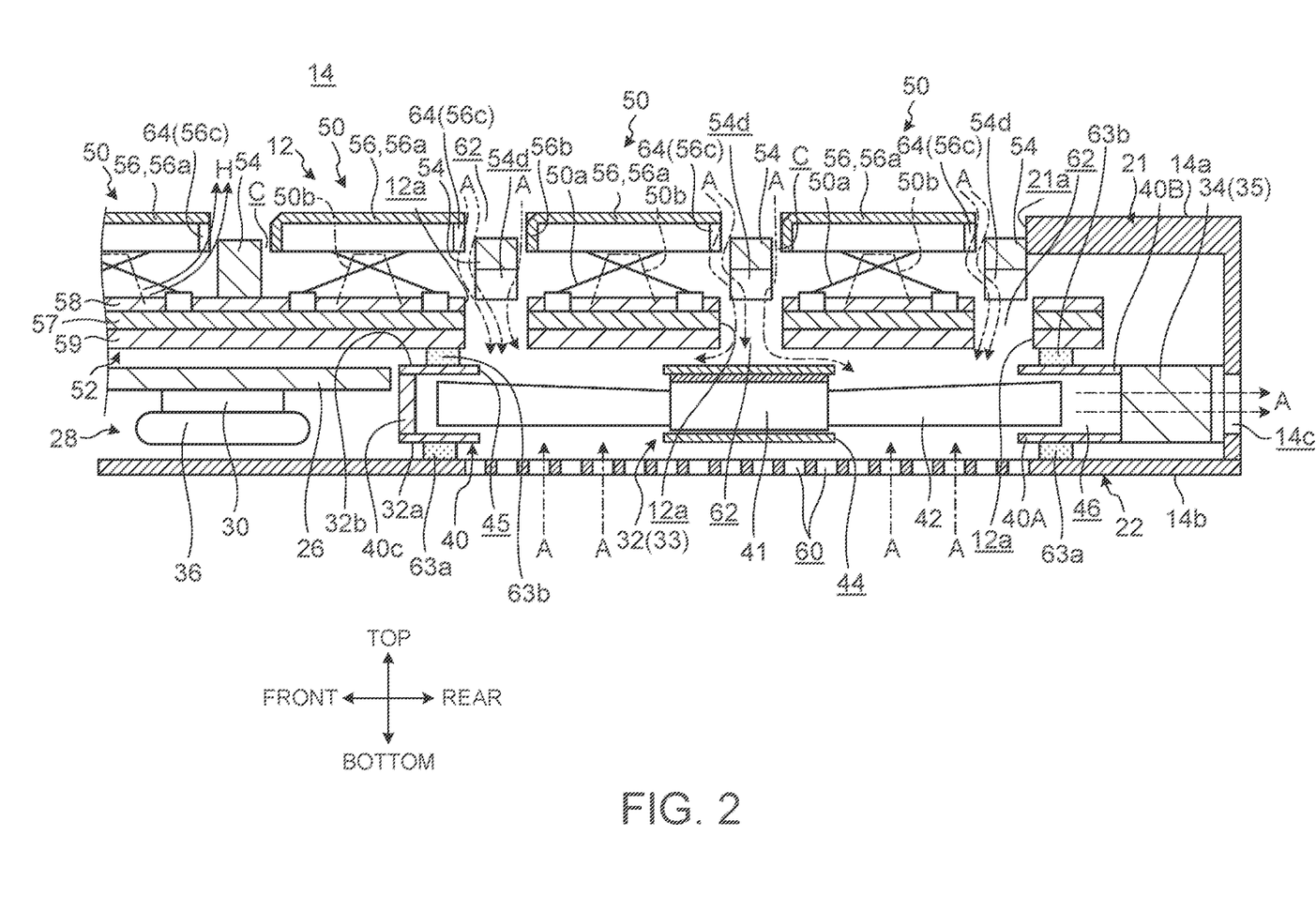
FIG. 2 is an essential-part-enlarged side-face sectional diagram schematically illustrating one example of an internal structure of a chassis.

FIG. 2 is an essential part enlarged side-face sectional diagram schematically illustrating one example of an inner structure of the chassis 14. As illustrated in FIG. 1 and FIG. 2, a substrate 26 and a cooling module 28 are housed in the chassis 14. Further, various kinds of electronic components and mechanical components and so forth of a battery device and so forth are installed in the chassis 14.

The substrate 26 is a mother board of the electronic apparatus 10. The substrate 26 is a printed board that a CPU (Central Processing Unit) 30 is implemented. Further, various kinds of electronic components such as a GPU (Graphics Processing Unit), a communication module, a memory, connection terminals and so forth are implemented on the substrate 26. The substrate 26 is arranged under the keyboard device 12. The substrate 26 is screwed to a rear surface of the keyboard device 12 and an inner surface of the cover member 21 and is thereby fixed to the chassis 14. An upper surface of the substrate 26 serves as an attachment surface for the cover member 21 and a lower surface of the substrate 26 serves as a mounting surface of the CPU 30 and so forth.

The CPU 30 is a processing device which executes arithmetic operations which relate to main control and processing of the electronic apparatus 10. The CPU 30 is the largest heating element in the devices which are loaded on the electronic apparatus 10.

The cooling module 28 absorbs, transports and discharges heat that mainly the CPU 30 generates to the outside of the chassis 14. It is also possible for the cooling module 28 to discharge heat which is generated from heating elements other than the CPU 30, such as, for example, a GPU 31 and so forth. The most part of the cooling module 28 is arranged under the substrate 26. The cooling module 28 is screwed to a lower surface of the substrate 26, a rear surface of the keyboard device 12, an inner surface of the cover member 21 and so forth and thereby is fixed to the chassis 14.

The cooling module 28 includes fan devices 32 and 33, cooling fins 34 and 35 and a heat pipe 36.

The cooling module 28 in one embodiment is used for cooling the CPU 30 and the GPU 31 and therefore one pair of the fan devices 32 and 33 and one pair of the cooling fins 34 and 35 are loaded on the cooling module 28. The cooling module 28 may be also configured to load one fan device and one cooling fin thereon respectively depending on a target to be cooled, an ability which is required for cooling and so forth. The basic configurations of the fan devices 32 and 33 are basically the same as each other or similar to each other except for a point that the sizes and the shapes of the fan devices 32 and 33 are slightly different from each other. Accordingly, in the following, the fan device 32 and the cooling fin 34 will be representatively described and description of the fan device 33 and the cooling fin 35 will be omitted.

The fan devices 32 and 33 are arranged in the vicinities of left and right rear corner parts of the chassis 14 respectively (see FIG. 1). As illustrated in FIG. 2, the fan device 32 (33) includes a fan chassis 40, a rotation unit 41 and an impeller 42. The fan device 32 (33) is a centrifugal fan that the rotation unit 41 is rotated by a motor and thereby the impeller 42, which is provided on the outer peripheral side of the rotation unit 41, rotates.

The fan chassis 40 is a flattened box body which houses the rotation unit 41 and the impeller 42. The fan chassis 40 has a lower plate 40A, an upper plate 40B and a side plate 40C. The respective plates 40A to 40C are, for example, metal plates.

The lower plate 40A is an almost bullet-shape thin plate that one side of a rectangle plate is formed into a circular shape. The lower plate 40A forms a lower surface 32a of the fan device 32 (33). A lower suction port 44 is formed in the lower plate 40A. The lower suction port 44 is a through hole of, for example, a circular shape, a donut shape or a shape that a plurality of ellipses is arrayed in a circumferential direction.

The upper plate 40B is a thin plate which has an external shape which is the same as the external shape of the lower plate 40A. The upper plate 40B forms an upper surface 32b of the fan device 32 (33). An upper suction port 45 is formed in the upper plate 40B. The upper suction port 45 may have a shape which is the same as or similar to the shape of the lower suction port 44. The suction ports 44 and 45 are openings which are used to take external air into the fan chassis 40 with the aid of rotation of the impeller 42.

The side plate 40C is a curved plate which covers a side part of a space in the fan chassis 40 which is formed between the lower plate 40A and the upper plate 40B. In one embodiment, the side plate 40C is configured integrally with the upper plate 40B.

An opening is formed in a rearward-facing side face of the fan chassis 40 owing to no installation of the side plate 40C or owing to formation of a hole in the side plate 40C. This opening serves as an exhaust port 46 of the fan device 32. The exhaust port 46 is arranged to face the cooling fin 34.

Front faces of the cooling fins 34 and 35 are arranged directly behind the fan devices 32 and 33 respectively and face the exhaust port 46. Rear surfaces of the cooling fins 34 and 35 face a chassis exhaust port 14c which opens to a rear-side surface of the chassis 14. The cooling fin 34 (35) has a structure that a plurality of plate-shaped metal fins is arrayed at equal intervals in a left-right direction on the surface of a base plate. Each fin stands upright in a top-bottom direction and extends in a front-rear direction. A clearance that air which is sent from the fan device 32 (33) passes is formed between the adjacent fins. The cooling fin 34 (35) is thermally connected with the CPU 30 via a heat pipe 36.

The heat pipe 36 is a pipe-shaped heat transport device. The heat pipe 36 is used alone or in a set of two or more pipes. The heat pipe 36 is the one that a metal pipe is smashed thin and flat into an oval shape in section and a working fluid is encapsulated into an internal closed space and may be a well-known heat pipe. In the heat pipe 36, for example, a heat absorption part which is located at one end is thermally connected with the CPU 30 and a heat radiation part which is located at the other end is connected with the cooling fin 34 (35).

In the cooling module 28 which is configured in this way, the heat which is generated from the CPU 30 and so forth and is transported through the heat pipe 36 is transferred to the cooling fin 34 (35). The heat which is transferred to the cooling fin 34 (35) is exhausted to the outside of the chassis 14 passing through the chassis exhaust port 14c with the aid of air which blows through the exhaust ports 46 in the fan device 32 (33). In FIGS. 1, 47 and 48 denote plate-shape heat transport devices which diffuse heat which is generated from the CPU 30 and so forth such as, for example, metal plates or vapor chambers.

Figure 3:
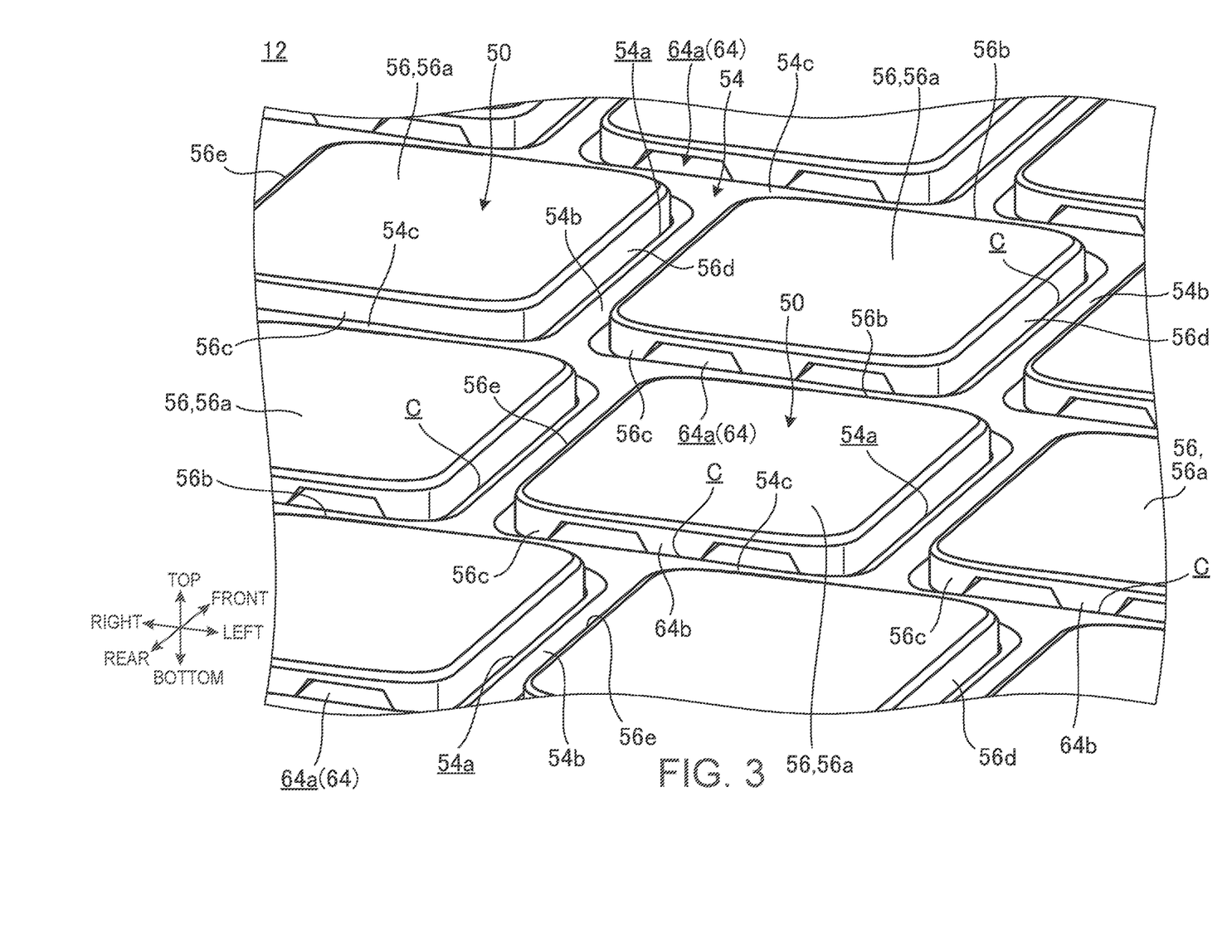
FIG. 3 is a perspective view illustrating one example of a state in which that part of a keyboard device is enlarged.

FIG. 3 is a perspective diagram illustrating one example of a state that part of the keyboard device 12 is enlarged. As illustrated in FIG. 2 and FIG. 3, the keyboard device 12 includes a plurality of key switches 50, a laminated plate 52 and a frame 54.

Each key switch 50 has a keycap 56 which is supported by a guide mechanism 50a and a rubber dome 50b to be movable upward/downward. The guide mechanism 50a is a scissors mechanism which couples together a lower surface of the keycap 56 and an upper surface of the laminated plate 52. The rubber dome 50b is a doom-shape member which is made of a flexible elastic material such as, for example, silicone rubber and so forth. The rubber dome 50b is arranged at the center of the guide mechanism 50a and is interposed between the keycaps 56 and the laminated plate 52.

Each keycap 56 is molded with, for example, a resin and is formed into an almost rectangular shape in a planer view. Each keycap 56 has an upper plate 56a and side walls 56b to 56e which are located on the four sides (see FIG. 4A and FIG. 4B).

Figure 4A:
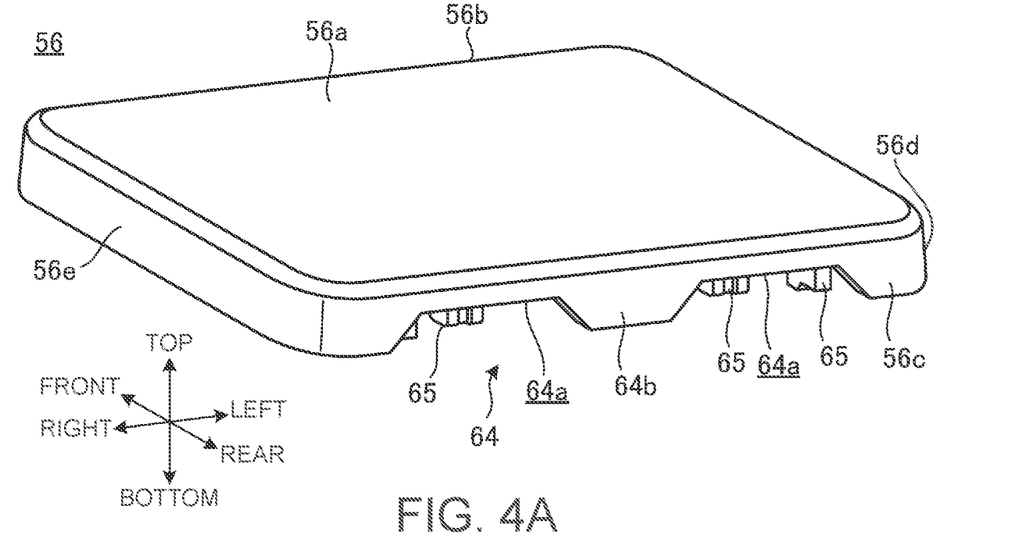
FIG. 4A is a perspective view illustrating one example of a state in which a keycap is viewed diagonally from above.
Figure 4B:
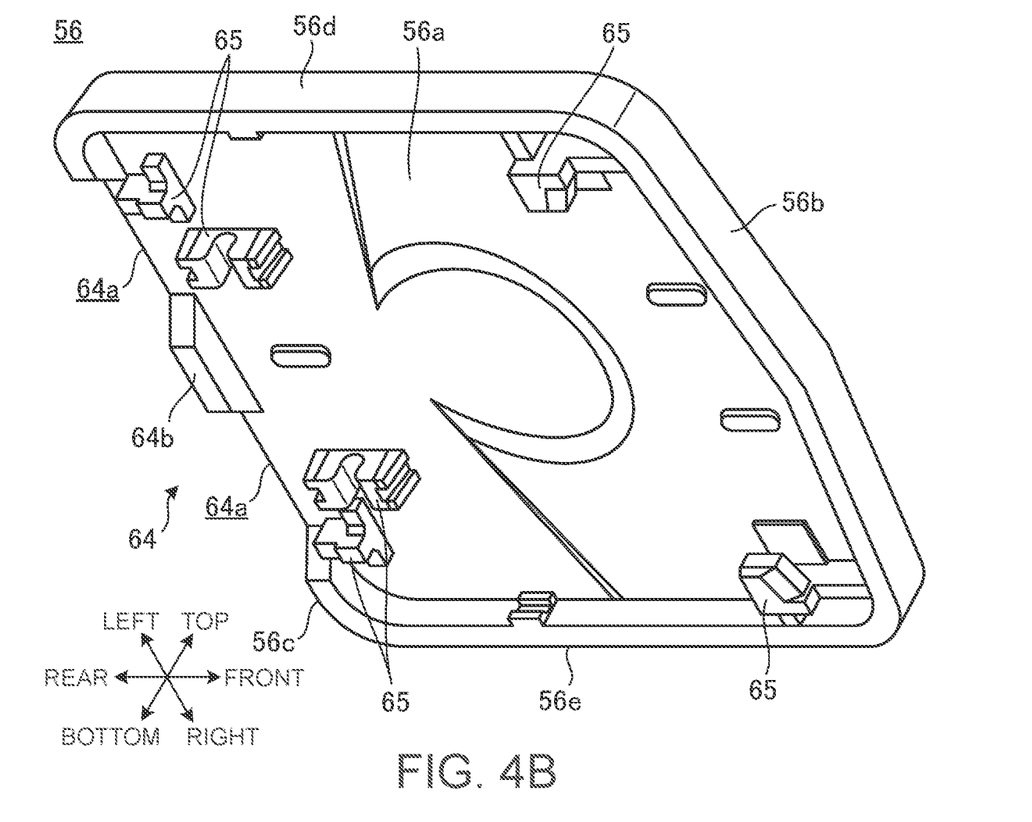
FIG. 4B is a perspective view illustrating one example of a state in which the keycap which is illustrated in FIG. 4A is viewed diagonally from below.

The upper plate 56a forms an operation surface of each key switch 50. The side walls 56b to 56e are disposed to hang down from a peripheral edge of the upper plate 56a. The side wall 56b forms a front side-surface of each keycap 56. The side wall 56c forms a rear side-surface of each keycap 56. The side wall 56d forms a left side-surface of each keycap 56. The side wall 56e forms a right side-surface of each keycap 56.

The laminated plate 52 has a base plate 57, a membrane sheet 58 which is laminated on an upper surface of the base plate 57 and a light guide plate 59 which is laminated on a lower surface of the base plate 57. The base plate 57 is a metal plate that cut and raised portions and hole portions are formed on/in various places. The membrane sheet 58 is a switch sheet which has a three-layered structure that a contact is closed, for example, in a case of being pressed. In the membrane sheet 58, the contact is closed by the rubber dome 50b which is compressed in a case where any one of the keycaps 56 is pressed down. The light guide plate 59 is a transparent resin plate which is adapted to guide light that a light source which is attached to a lower surface of the light guide plate 59 emits in the left-right direction, to reflect the light from a light reflection surface and to irradiate each keycap 56 with the reflected light from the rear surface of each keycap 56. Installation of the light guide plate 59 may be omitted and, in this case, a waterproof sheet may be laminated on a lower surface of the base plate 57.

The frame 54 is a meshed plate which is made of resin, metal and so forth. The frame 54 is fixed to an upper surface of the laminated plate 52 by screwing and so forth. The frame 54 may be molded integrally with the cover member 21. The frame 54 is adapted to arrange around respective keycaps 56 and to isolate the respective keycaps 56 from one another.

The frame 54 has a plurality of key placement holes 54a into which the respective keycaps 56 are inserted to be movable upward/downward. Each key placement hole 54a is a rectangular space which is surrounded by vertical frames 54b which extend in the front-rear direction and horizontal frames 54c which extend in the left-right direction in each mesh of the frame 54.

As illustrated in FIG. 2, the chassis 14 includes one set of lower communication holes 60 which is adapted to flow air A into the chassis 14 from a lower surface 14b of the chassis 14.

Each lower communication hole 60 is a through hole which is formed in a cover member 22 which forms the lower surface 14 of the chassis 14. One set of lower communication holes 60 has a configuration that, for example, a plurality of slit-shaped hole portions is arranged in parallel. One set of lower communication holes 160 is disposed at a position that one set of lower communication holes 160 overlaps with the lower suction port 44 in the fan device 32 (33) in the planar view and faces the lower suction port 44.

As illustrated in FIG. 2, the chassis 14 includes an upper communication hole 62 which is adapted to flow the air A into the chassis 14 from above.

The upper communication hole 62 is a through hole which penetrates through the keyboard device 12 in the top-bottom direction. A clearance between the adjacent keycaps 56 and 56, a notched recessed portion 54d and a hole portion 12a communicate with one another in order from above toward below and thereby the upper communication hole 62 is formed. The notched recessed portion 54d is a portion which forms a flow path of the air A by notching a lower-surface side of the frame 54. The hole portion 12a is a through hole which is formed in the laminated plate 52.

The upper communication hole 62 communicates with the upper suction port 45 in the fan device 32 (33). In one embodiment, the upper communication hole 62 is disposed at a position where the upper communication hole 62 overlaps with the upper suction port 45 in the fan device 32 (33) in the planar view and faces the upper suction port 45. In a case of configuring to place a cover member 21 under the keyboard device 12, it is preferable for the upper communication hole 62 to include also a hole portion which is formed in the cover member 21 which is placed under the keyboard device 12.

Accordingly, as illustrated in FIG. 2, the fan devices 32 (33) sucks the air A which is present on the lower side of the chassis 14 from the set of lower communication holes 60 in the cover member 22 through the lower suction port 44. At the same time, the fan device 32 (33) sucks the air A which is present on the upper side of the chassis 14 from the upper communication hole 62 through the upper suction port 45. In a case where the fan device 32 (33) discharges the air A which is sucked through each of the suction ports 44 and 45 to the outside of the chassis 14 through the exhaust port 46, the fan device 32 (33) cools the cooling fin 34 (35). Thereby, it becomes possible for the fan device 32 (33) to take in the air sufficiently from the upper and lower surfaces of the chassis 14 and therefore it becomes possible to obtain high cooling efficiency.

In FIGS. 2, 63a and 63b denote sealing materials which are made of sponge and so forth. The sealing material 63a forms a cutoff wall around the lower suction port 44 in the fan device 32. The sealing material 63b forms a cutoff wall around the upper suction port 45 in the fan device 32. The sealing materials 63a and 63b avoid intrusion of water into the substrate 26 and so forth in the chassis 14 in a case where a liquid such as a beverage and so forth is spilled on the keyboard device 12.

Incidentally, it is desired to make a clearance between each of the side walls 56b to 56d of each keycap 56 and the frame 54 narrower to the greatest possible extent. The reason therefor lies in avoidance of intrusion of foreign materials into the chassis 14 through each clearance by improving the quality of the outer appearance of the keyboard device 12. Also, in the electronic apparatus 10 according to one embodiment, a clearance C between each keycap 56 and the frame 54 is extremely narrow (see FIG. 2 and FIG. 3) and is set to, for example, about 0.4 mm. As a result, it is feared that the suction amount of the air which is sucked through the upper communication hole 62 would be limited because the clearance C acts as a bottleneck and therefore it would become impossible for the fan device 32 (33) to suck a sufficient amount of the air A.

Accordingly, in the electronic apparatus according to one embodiment, the clearance C is widened and a flow path formation part 64 which forms an air flow path in the widened clearance C is provided in each keycap 56. FIG. 4A is a perspective view illustrating one example of a state that the keycap 56 is viewed diagonally from above. FIG. 4B is a perspective view illustrating one example of a state that the keycap 56 is viewed diagonally from below.

As illustrated in FIG. 4A and FIG. 4B, the flow path formation part 64 has one pair of hole portions 64a and 64a which is formed in the rear-side side wall 56c of each keycap 56. The hole portion 64a is a notch-shape hole which is formed by notching the side wall 56c into an almost trapezoidal shape upwards from a lower end surface of the side wall 56c. The hole portion 64a may be also called a notch-shape recessed portion, in place of the notch-shape hole portion. The hole portion 64a may have an arch shape, a rectangular shape and so forth. The hole portion 64a may be not a notch-shape hole but a through hole which penetrates through the side wall 56c. The hole portion 64a may be either formed when molding each keycap 56 or formed by machining after molding of each keycap 56.

One pair of the hole portions 64a is formed in the side wall 56c in a state of being arranged side by side along a longitudinal direction (the left-right direction) of the side wall 56c. Three or more hole portions 64a may be formed in the side wall 56c. A protection wall 64b which is formed by hanging down part of the side wall 56c is provided between the mutually adjacent hole portions 64a and 64a. The protection wall 64b is a wall member for preventing each keycap 56 from being erroneously removed in a case where a nail or the like of a user is caught in the hole portion 64a. In the flow path formation part 64 which is illustrated in FIG. 4A and FIG. 4B, the side wall 56c which includes the protection wall 64b is formed into an almost M-shape. Accordingly, the protection wall 64b is formed to be widened at the root (an upper part) and therefore has high strength and rigidity.

In FIG. 4B, 65 denotes a plurality of projections for supporting the guide mechanism 50a which is formed on the lower surface of the upper plate 56a. The respective projections 65 are arranged along the front and rear side walls 56b and 56c respectively. It is preferable to dispose each projection 65 at a position which is closer to the side walls 56b and 56c to the extent possible in order to secure a stable elevating operation of the guide mechanism 50a. In this respect, the hole portions 64a which configure the flow path formation part 64 do not project to the center side of each keycap 56 and therefore do not interfere with the projections 65.

As illustrated in FIG. 3, in one embodiment, the flow path formation part 64 is installed only in the rearward facing side wall 56c in the side walls 56b to 56e on the four sides of each keycap 56. The flow path formation part 64 may be formed in some of or all the other side walls 56b, 56d and 56e, in addition to or in place of the side wall 56c.

However, as illustrated in FIG. 3, the flow path formation parts 64 are exposed to the outside of the keyboard device 12. In one embodiment, in particular, the keyboard device 12 has a configuration that the keycaps 56 project upward from the upper surface of the frame 54 and therefore the flow path formation parts 64 are conspicuous in outer appearance. For this reason, there are such advantages that in a case where the flow path formation part 64 is formed on the rearward facing side wall 56c, it becomes more difficult for the flow path formation part 64 to come into sight of the user than in a case where the flow path formation parts 64 are formed on the forward facing and laterally facing side walls 56b, 56d and 56e, light leakage from the light guide plate 59 becomes more inconspicuous and it becomes possible to suppress a reduction in outer appearance quality.

Figure 5:
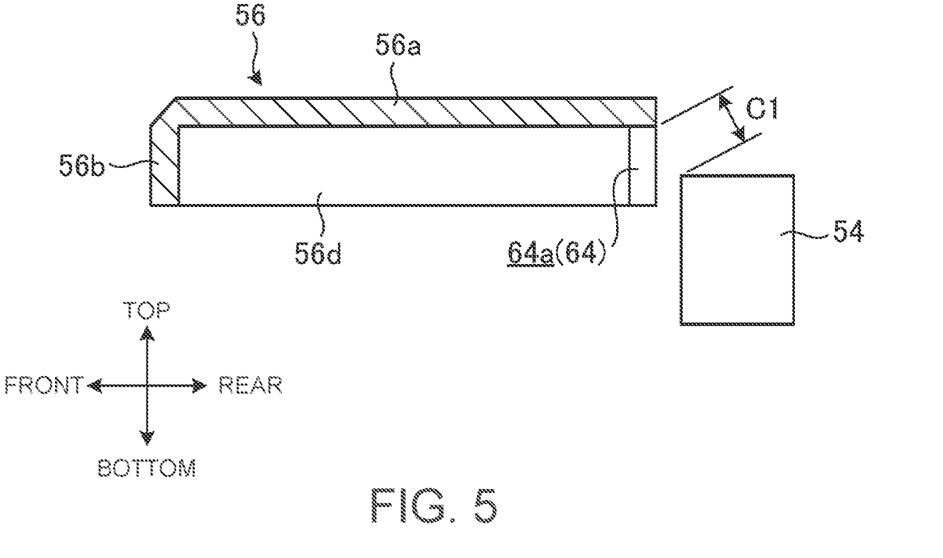
FIG. 5 is a partially sectional side view illustrating one example of a relation between a keycap which has a flow path formation part and a frame.
Figure 6:
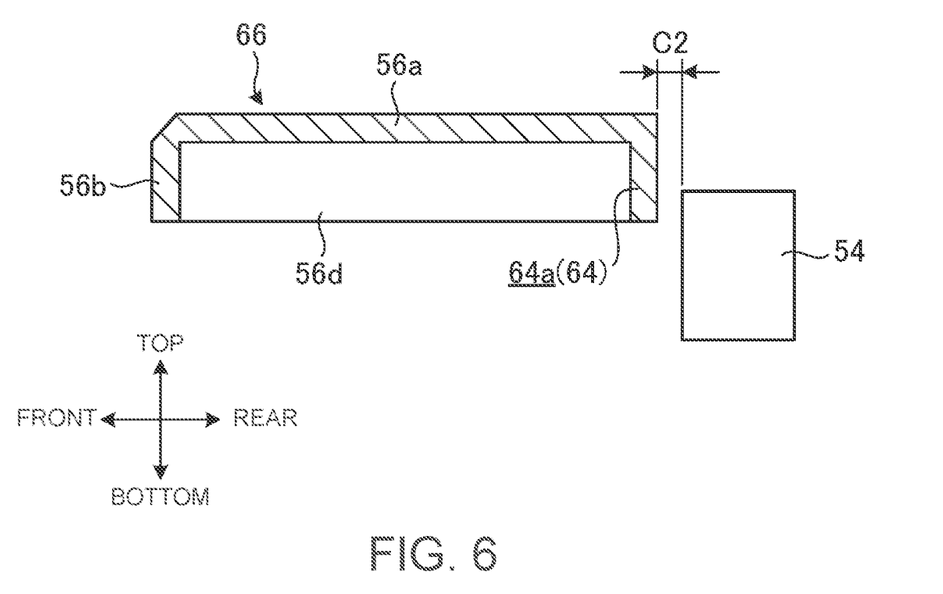
FIG. 6 is a partially sectional side view illustrating one example of a relation between an existing keycap which has no flow path formation part and a frame.

FIG. 5 is a partially sectional side view illustrating one example of a relation between each keycap 56 which has the flow path formation part 64 and the frame 54. FIG. 6 is a partially sectional side view illustrating one example of a relation between an existing keycap 66 which has no flow path formation part 64 and the frame 54.

In the keycap 56 in one embodiment which is illustrated in FIG. 5, the clearance C between the side wall 56c and the frame 54 is enlarged to a wider clearance C1 owing to formation of the hole portion 64a in the flow path formation part 64. The clearance C1 is, for example, 0.9 mm. On the other hand, since in the existing keycap 66 in FIG. 6, the flow path formation part 64 is not provided in the side wall 56c, a clearance C2 between the side wall 56c and the frame 54 is drastically smaller than the clearance C1. The clearance C2 is, for example, 0.4 mm which is the same as the size of the clearance C.

Accordingly, in the electronic apparatus 10 according to one embodiment, the clearance C between each keycap 56 and the frame 54 is widened to the clearance C1 owing to formation of the flow path formation part 64 and thereby a wider air flow path is formed.

Here, an effect of increasing the air suction amount of the fan device 32 owing to presence of the flow path formation part 64 will be described.

Figure 7:
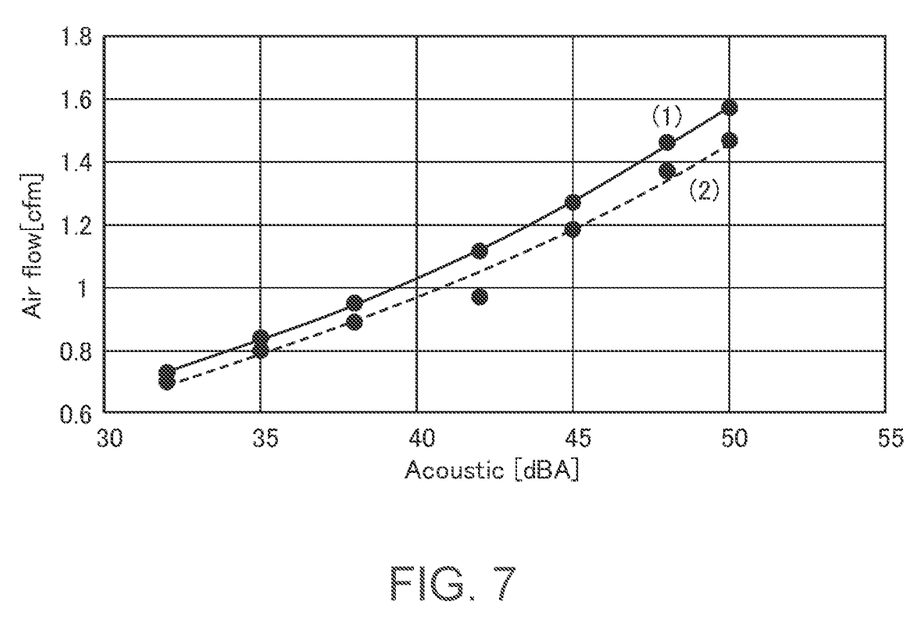
FIG. 7 is a graph illustrating one example of a result of an experiment that an air suction amount of one fan device which is configured so that the keycap which has the flow path formation part is compared with an air suction amount of another fan device which is configured so that the keycap has no flow path formation part.

FIG. 7 is a graph illustrating one example of a result of an experiment that the air suction amounts of the fan devices 32 which are configured by using the keycap 56 which has the flow path formation part 64 and the existing keycap 66 which has no flow path formation part 64 are compared with each other. In FIG. 7, the horizontal axis indicates a noise (dBA) and the vertical axis indicates an air flow rate (cfm) of the fan device 32. In addition, a solid-line graph (1) indicates a result of the experiment which is obtained from the keycap 56 which has the flow path formation part 64 in FIG. 5 in one embodiment of the present invention. A broken-line graph (2) indicates a result of the experiment which is obtained from the existing keycap 66 which has no flow path formation part 64 which is illustrated in FIG. 6.

Here, in general, the electronic device such as the laptop PC controls the maximum number of revolutions of the fan device 32 within a noise allowable range and controls the number of revolutions of the fan device 32 such that, for example, the noise level does not exceed 50 (dBA). Accordingly, it becomes possible for the cooling module 28 to obtain a higher cooling performance as the air volume (cfm) of the fan device 32 which is obtained at the noise level of 50 dBA is more increased.

As illustrated in FIG. 7, it is found that the graph (1) which indicates the result of the experiment which is obtained by using the keycap 56 in one embodiment of the present invention is large in the air volume (cfm) at the noise levels (dBA) in all ranges in comparison with the graph (2) which indicates the result of the experiment which is obtained by using the existing keycap 66. Specifically, the air volume of the fan device 32 in the graph (1) is increased by about 6% in all noise values in comparison with the air volume in the graph (2). That is, it is found that in the electronic apparatus 10 according to one embodiment of the present invention, the air volume of the fan device 32 is increased and the cooling performance of the cooling module 28 is improved by forming the flow path formation part 64 in each keycap 56.

Figure 8:
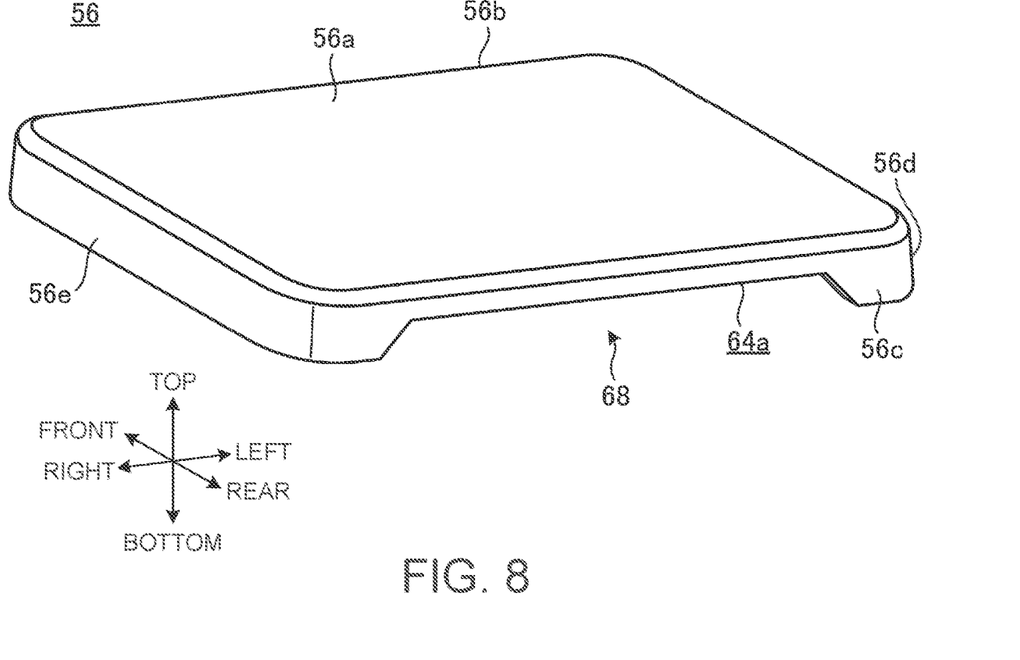
FIG. 8 is a perspective view illustrating one example of a state in which a keycap which has a flow path formation part pertaining to the first modified example is viewed diagonally from above.

FIG. 8 is a perspective diagram illustrating one example of a state that the keycap 56 which has a flow path formation part 68 pertaining to the first modified example is viewed diagonally from above. The flow path formation part 68 which is illustrated in FIG. 8 is different from the flow path formation part 64 which is illustrated in FIG. 4A in the point that the flow path formation part 68 has one hole portion 64a which extends over almost the full width of the side wall 56c and the protection wall 64b is not provided at the center. It becomes possible for the flow path formation part 68 to make the air flow path larger than the air flow path which is obtained by the flow path formation part 64 by the amount that there exists no protection wall 64b and to more increase the air suction amount of the fan device 32.

Figure 9:
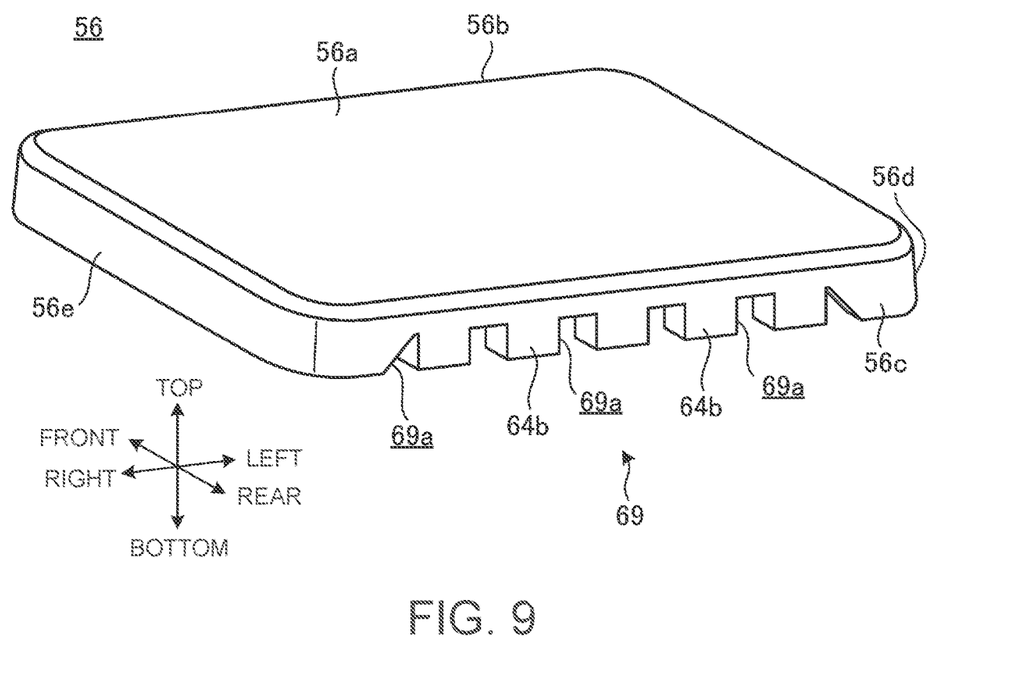
FIG. 9 is a perspective view illustrating one example of a state in which a keycap which has a flow path formation part pertaining to the second modified example is viewed diagonally from above.

FIG. 9 is a perspective view illustrating one example of a state that the keycap 56 which has a flow path formation part 69 pertaining to the second modified example is viewed diagonally from above. The flow path formation part 69 which is illustrated in FIG. 9 is different from the flow path formation part 64 which is illustrated in FIG. 4A in the point that the flow path formation part 69 has a plurality of slits 69a which is narrower than the hole portion 64a in the flow path formation part 64 in FIG. 4A. Respective slits 69a are hole portions or recessed portions which are formed in the side wall 56c in a state of being arrayed side by side along the longitudinal direction. The protection wall 64b is provided also between the mutually adjacent slits 69a. Although the flow path formation part 69 becomes smaller than the flow path formation 64 in air flow path, the flow path formation part 69 is higher than the flow path formation part 64 in the effect of avoiding the intrusion of the nails, the foreign matters and so forth because the protection walls 64b are arrayed in a lattice shape.

Figure 10A:
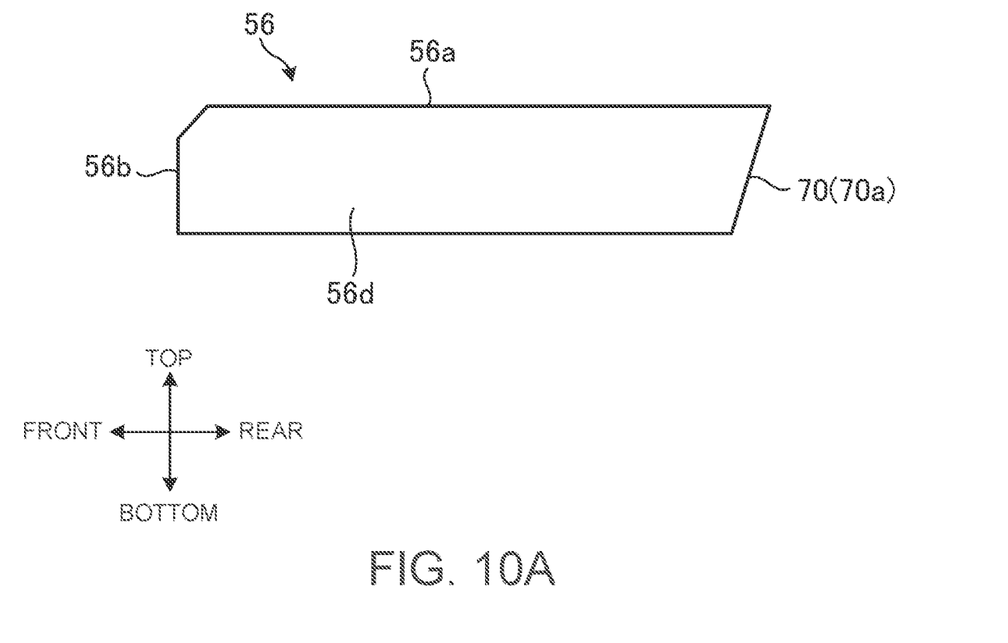
FIG. 10A is a side view illustrating one example of a keycap which has a flow path formation part pertaining to the third modified example.
Figure 10B:
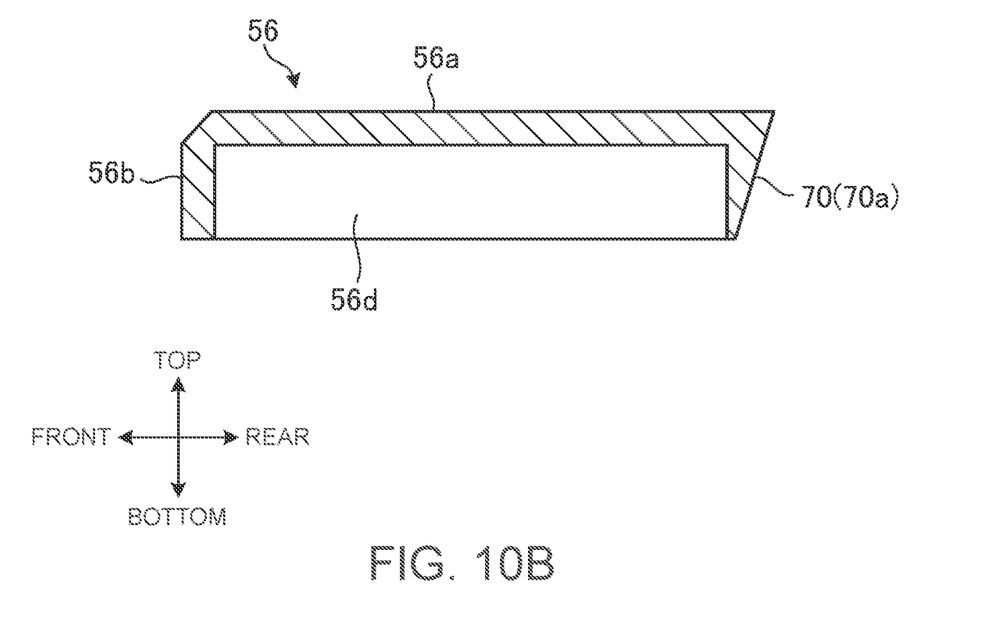
FIG. 10B is a side-face sectional diagram illustrating one example of the keycap which is illustrated in FIG. 10A.

FIG. 10A is a side view illustrating one example of the keycap 56 which has a flow path formation part 70 pertaining to the third modified example. FIG. 10B is a side face sectional diagram illustrating one example of the keycap 56 which is illustrated in FIG. 10A. The flow path formation part 70 which is illustrated in FIG. 10A and FIG. 10B has an inclined plane 70a which is provided on the surface of the side wall 56c. The inclined plane 70a gradually inclines in a direction (forwardly) away from the frame 54 toward a lower end of the side wall 56c. Although the flow path formation part 70 becomes smaller than the flow path formation 64 in the air flow path, the flow path formation part 70 is greatly higher than the flow path formation part 64 in the effect of avoiding the intrusion of the nails, the foreign matters and so forth because the inclined plane 70a itself functions in the same manner as the protection wall 64b.

Figure 11:
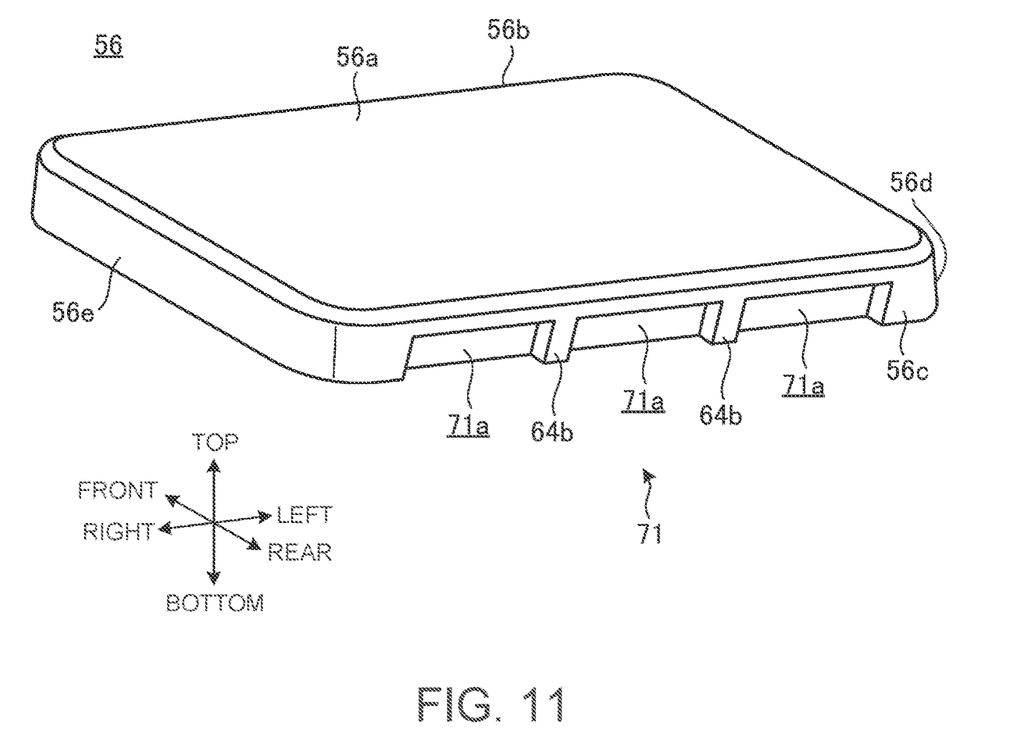
FIG. 11 is a perspective view illustrating one example of a state in which a keycap which has a flow path formation part pertaining to the fourth modified example is viewed diagonally from above.

FIG. 11 is a perspective view illustrating one example of a state that the keycap 56 which has a flow path formation part 71 pertaining to the fourth modified example is viewed diagonally from above. The flow path formation part 71 which is illustrated in FIG. 11 has a grooved portion 71a which is formed in the surface of the side wall 56c. The grooved portion 71a is a groove-shape recessed portion which is formed along the top-bottom direction of the side wall 56c. The protection wall 64b is also provided between the mutually adjacent grooved portions 71a. Although the flow path formation part 71 becomes smaller than the flow path formation part 64 in the air flow path, the flow path formation part 71 is greatly higher than the flow path formation part 64 in the effect of avoiding the intrusion of the nails, the foreign matters and so forth because also the grooved portion 71a itself functions in the same manner as the protection wall 64b. The flow path formation part 71 may be also configured to widen one grooved portion 71a across almost the full width of the side wall 56c.

As described above, in the electronic apparatus 10 according to one embodiment of the present invention, the clearance C between each keycap 56 and the frame 54 is enlarged by installation of the flow path formation part (64, 69 to 71) in each keycap 56 and thereby the air flow path is secured.

Accordingly, in the electronic apparatus 10, the flow rate of the air A which flows from the upper communication hole 62 which penetrates through the keyboard device 12 to the upper suction port 45 is increased. Therefore, in the electronic apparatus 10, the air volumes of the fan devices 32 and 33 are increased and the cooling performance of the cooling module 28 is improved. As a result, it becomes possible for the electronic apparatus 10 to reduce the amount of heat which is generated from the CPU 30 and so forth and is transmitted to the keyboard device 12 and to suppress temperature rising of the keyboard device 12. In this case, the flow path formation part 64 and so forth may be provided in the keycap 56 which is located at the position that the keycap 56 overlaps with at least the fan devices 32 and 33 in the top-bottom direction (see FIG. 2).

Incidentally, it becomes also possible for the electronic apparatus 10 to discharge the heat which is transmitted from the CPU 30 and so forth to the keyboard device 12 upward through the flow path formation part 64 and so forth by installation of the flow path formation part (64, 69 to 71) in each keycap 56. That is, as illustrated in FIG. 2, in the electronic apparatus 10, the heat H which is transmitted from the CPU 30 and so forth to the keyboard device 12 is smoothly discharged upward through the clearance C (C1) which is enlarged by installation of the flow path formation part 64 and so forth in each cap 56. In FIG. 2, each solid line arrow H schematically indicates the flow of the heat Accordingly, the upper communication hole 62 which penetrates through the keyboard device 12 is not essential in the electronic apparatus 10. That is, even in a case where the electronic apparatus 10 is configured to have no upper through hole 62, it is possible for the electronic apparatus 10 to effectively discharge the heat through the clearance C (C1) which is enlarged by installation of the flow path formation part 64 and so forth in each keycap 56 and thereby to suppress the temperature rising of the keyboard device 12. In this case, it is desirable that the flow path formation part 64 and so forth be installed in as many keycaps 56 as possible, preferably, in all the keycaps 56.

Incidentally, it goes without saying that the present invention is not limited to the above-described embodiment and the modified examples and it is possible to freely alter the configuration of the electronic apparatus 10 within the range not deviating from the gist of the present invention.

The invention claimed is:

1. An electronic apparatus comprising:
   a chassis;
   a keyboard device on an upper surface side of the chassis and which has a plurality of keycaps; and
   a frame on the upper surface side of the chassis and which isolates the respective keycaps of the keyboard device from one another, wherein
   at least one of the plurality of keycaps has
      an upper plate which forms an operation surface, and side walls that extend from a peripheral edge part of the upper plate and face the frame, and
      in at least one of the side walls, a flow path formation part which provides a clearance between the at least one side wall and the frame and thereby forms an air flow path;
   wherein the flow path formation part is an inclined plane on a surface of the at least one side wall and inclines from a bottom of the at least one side wall and outwards toward an edge of the upper plate that extends beyond another side wall adjacent to the at least one side wall.

2. The electronic apparatus according to claim 1, wherein the flow path formation part is only in a rearward facing side wall of the side walls.

3. The electronic apparatus according to claim 1, further comprising:
   a fan device under the keyboard device in the chassis and which has a suction port in an upper surface thereof; and
   a communication hole that penetrates through the keyboard device in a top-bottom direction and makes air pass to the suction port from an upper part of the keyboard device, wherein
   the flow path formation part is in the at least one keycap and at a position where the at least one keycap overlaps with at least the fan device in the top-bottom direction.

4. The electronic apparatus according to claim 1, wherein the flow path formation part is a hole part or a recessed part in the at least one side wall.

5. The electronic apparatus according to claim 4, wherein the flow path formation part has a notched shape which extends upward, starting from a lower end surface of the at least one side wall.

6. The electronic apparatus according to claim 5, wherein the flow path formation part is in a paired state such that two flow path formation sub-parts are arrayed side by side along the at least one side wall, and
   a wall member which is part of the at least one side wall is between the flow path formation sub-parts which are arrayed side by side.

7. The electronic apparatus according to claim 1, wherein the flow path formation part is a grooved part in a surface of the at least one side wall and extends along the top-bottom direction of the at least one side wall.

8. An electronic apparatus comprising:
   a chassis;
   a keyboard device on an upper surface side of the chassis and which has a plurality of keycaps; and
   a frame on the upper surface side of the chassis and which isolates the respective keycaps of the keyboard device from one another, wherein
   at least one of the plurality of keycaps has
      an upper plate which forms an operation surface, and side walls that from a peripheral edge part of the upper plate and face the frame, and
      in at least one of the side walls, a hole part or a recessed part is located;
   wherein the at least one side wall is an inclined plane and inclines from a bottom of the at least one side wall and outwards toward an edge of the upper plate that extends beyond another side wall adjacent to the at least one side wall.

9. An electronic apparatus comprising:
   a chassis;
   a keyboard device on an upper surface side of the chassis and which has a plurality of keycaps; and
   a frame on the upper surface side of the chassis and which isolates the respective keycaps of the keyboard device from one another, wherein
   at least one of the plurality of keycaps has
      an upper plate which forms an operation surface, and side walls that extend from a peripheral edge part of the upper plate and face the frame, and
      in at least one of the side walls, an inclined plane inclines from a bottom of the at least one side wall and outwards toward an edge of the upper plate that extends beyond another side wall adjacent to the at least one side wall.

* * * * *